United States Patent
Wang et al.

(10) Patent No.: US 12,372,426 B2
(45) Date of Patent: Jul. 29, 2025

(54) LEAKAGE DETECTION APPARATUS AND METHOD AND CABINET SYSTEM

(71) Applicant: HUAWEI TECHNOLOGIES CO., LTD., Guangdong (CN)

(72) Inventors: Changqi Wang, Hangzhou (CN); Xian Zhang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 415 days.

(21) Appl. No.: 17/936,370

(22) Filed: Sep. 28, 2022

(65) Prior Publication Data

US 2023/0014670 A1 Jan. 19, 2023

Related U.S. Application Data

(63) Continuation of application No. PCT/CN2021/083626, filed on Mar. 29, 2021.

(30) Foreign Application Priority Data

Apr. 3, 2020 (CN) .......................... 202010261379.7

(51) Int. Cl.
  *G01M 3/18* (2006.01)
  *H05K 7/20* (2006.01)

(52) U.S. Cl.
  CPC .......... *G01M 3/18* (2013.01); *H05K 7/20272* (2013.01)

(58) Field of Classification Search
  CPC .............................. G01M 3/18; H05K 7/20272
  See application file for complete search history.

(56) References Cited

U.S. PATENT DOCUMENTS

| | | | |
|---|---|---|---|
| 9,624,671 B1 | 4/2017 | Gunness | |
| 2016/0178475 A1* | 6/2016 | Krishnan | H05K 7/20836 |
| | | | 324/713 |

FOREIGN PATENT DOCUMENTS

| | | | | |
|---|---|---|---|---|
| CA | 3040049 A1 | * | 4/2018 | ......... H05K 7/20781 |
| CN | 203851413 U | * | 9/2014 | |
| CN | 109041530 A | * | 12/2018 | ......... H05K 7/20272 |
| CN | 109521860 A | | 3/2019 | |
| CN | 110022659 A | * | 7/2019 | ........... H05K 7/1488 |
| CN | 110243552 A | | 9/2019 | |
| CN | 110530588 A | * | 12/2019 | .............. G01M 3/40 |
| JP | 2019531556 A | * | 10/2019 | |
| JP | 2019533873 A | * | 11/2019 | |
| WO | WO-2019128451 A1 | * | 7/2019 | .............. G01M 3/00 |

* cited by examiner

Primary Examiner — Jamel E Williams

(57) ABSTRACT

This application discloses a leakage detection apparatus and method, and a cabinet system, and relates to the server field. The apparatus is applied to a cabinet system, the cabinet system includes a plurality of nodes, with each node using a liquid cooling apparatus for heat dissipation. The apparatus includes: a detection circuit, coupled to the plurality of nodes, comprises a plurality of branch circuits for leakage detection of a plurality of liquid cooling apparatuses in the plurality of nodes; and a monitoring device, coupled to the detection circuit and configured to monitor a leakage status of the liquid cooling apparatus in each node, and determine, when leakage occurs in a faulty liquid cooling apparatus, a faulty node where the faulty liquid cooling apparatus resides.

19 Claims, 5 Drawing Sheets

LEAKAGE DETECTION APPARATUS AND METHOD AND CABINET SYSTEM

CROSS-REFERENCE TO RELATED APPLICATIONS

This application is a continuation of International Application No. PCT/CN2021/083626, filed on Mar. 29, 2021, which claims priority to Chinese Patent Application No. 202010261379.7 filed on Apr. 3, 2020. The disclosures of the aforementioned applications are hereby incorporated by reference in their entireties.

TECHNICAL FIELD

This application relates to the server field, and in particular, to a leakage detection apparatus and method, and a cabinet system.

BACKGROUND

Cabinets in data centers have a plurality of nodes stacked on them. The mainboard of each node includes processing chips, such as a central processing unit (central processing unit, CPU). The processing chip in the mainboard generates a large amount of heat in a working process and requires heat dissipation. Currently, a liquid cooling cold plate may be provided on the processing chip. The liquid cooling cold plate is connected to a cooling apparatus and a pump, so that liquid flows in the liquid cooling cold plate. Heat generated by the chip is conducted to the flowing liquid, and then the cooling apparatus dissipates heat for the liquid, so that the heat dissipation apparatus dissipates heat for the chip.

The liquid cooling cold plate needs to cover a surface of the chip for heat dissipation, and the flowing liquid needs to go through a loop consisting of the heat dissipation apparatus and the pump for liquid cooling. If pipe leakage occurs in the foregoing process, problems such as a short circuit may occur in the chip or a printed circuit board (print circuit board, PCB) to cause component damage. Therefore, how to provide an effective leakage detection method becomes a technical problem to be resolved as soon as possible.

SUMMARY

This application provides a leakage detection apparatus and method, and a cabinet system, to effectively detect leakage.

According to a first aspect, this application provides a leakage detection apparatus, where the apparatus is applied to a cabinet system, the cabinet system includes at least one node, each of the at least one node uses a liquid cooling apparatus for heat dissipation, and the apparatus includes a monitoring module and a detection circuit. The monitoring module is configured to monitor a leakage status of the liquid cooling apparatus in each node, and uses a detection circuit to locate, when leakage occurs in a liquid cooling apparatus in any node, a node where the faulty liquid cooling apparatus resides. The detection circuit is configured to connect to the monitoring module, and locate, when leakage occurs in the liquid cooling apparatus in any node, the node where the faulty liquid cooling apparatus resides. The faulty node where the leaking liquid cooling apparatus resides can be located by using the monitoring module and the detection circuit, which implements effective leakage detection. In addition, one monitoring module can implement detection on the liquid cooling apparatus in the at least one node, which reduces costs.

In a possible implementation, the monitoring module includes a processing module and a voltage detection module, an input end of the voltage detection module is connected to the detection circuit, and an output end of the voltage detection module is connected to the processing module. The voltage detection module is configured to, when detecting a voltage signal on the detection circuit, determine the faulty node where the faulty liquid cooling apparatus resides, and send an indication signal to the processing module. The processing module is configured to receive the indication signal and uses the detection circuit to locate the node where the faulty liquid cooling apparatus resides. Only one voltage detection module is required to monitor the voltage signal on the detection circuit to implement detection on the liquid cooling apparatus in the at least one node, which reduces hardware costs.

In another possible implementation, the detection circuit includes a first trunk circuit, a second trunk circuit, and M branch circuits, where M is an integer greater than 0, and the M branch circuits are respectively located in M nodes included in the cabinet system. Each branch circuit is connected to the first trunk circuit, and each branch circuit is connected to the second trunk circuit through a switch. One end of the first trunk circuit is connected to a power supply of the cabinet system, and the other end of the first trunk circuit is separately connected to each branch circuit. One end of the second trunk circuit is connected to the monitoring module, and the other end of the second trunk circuit is separately connected to a switch of each branch circuit. The M switches are in a turn-on state, and the M switches include a switch connected to each branch circuit. A branch circuit of a faulty node is configured to connect the first trunk circuit and the second trunk circuit when liquid leaking from a liquid cooling apparatus in the faulty node passes through the branch circuit of the faulty node. The monitoring module is configured to, when detecting a voltage signal on the second trunk circuit, detect the node where the faulty liquid cooling apparatus resides by controlling the M switches. In this way, one monitoring module is used to control the M switches to detect the node where the faulty liquid cooling apparatus resides. This implements detection on the liquid cooling apparatuses in the M nodes by using only one monitoring module, which reduces hardware costs.

In another possible implementation, the monitoring module is configured to control the M switches to be turned off, select a switch from the M switches, control the selected switches to be turned on, and determine that a node corresponding to the selected switch is the node where the faulty liquid cooling apparatus resides when detecting a voltage signal on the second trunk circuit. In this way, the node where the faulty liquid cooling apparatus resides is detected by controlling the M switches.

In another possible implementation, the detection circuit further includes M control modules, the M control modules are respectively located in the M nodes, the M control modules are in communication connection with the monitoring module, and each of the M control modules is connected to a control end of a switch corresponding to a node where the control module resides. The monitoring module is configured to send a turn-off command to the M control modules when detecting a voltage signal on the second trunk circuit. Any control module is configured to receive the turn-off command and control a switch connected to the any control module to be turned off. The control module controls the switch to be turned off. In this way, a common switch may be used as the switch. The monitoring module uses the control module to control the switch to be turned off, which reduces costs.

In another possible implementation, the monitoring module is further configured to, after sending the turn-off command to the M control modules, select a control module from the M control modules and send a turn-on command to the selected control module. The selected control module is configured to receive the turn-on command and control a switch connected to the selected control module to be turned on. The monitoring module is further configured to, when detecting a voltage signal on the second trunk circuit, determine that the node where the selected control module resides is the node where the faulty liquid cooling apparatus resides. In this way, the faulty node is detected by controlling the M switches.

In another possible implementation, the any control module is a baseboard management controller BMC in a node where the module resides. In this way, a component in the node may be reused to implement functions of the control module, which reduces hardware costs.

In another possible implementation, a cabinet backplane is disposed in a cabinet included in the cabinet system, and the first trunk circuit and the second trunk circuit are located in the cabinet backplane. This simplifies wiring in the cabinet.

In another possible implementation, a switch corresponding to any one of the M nodes is disposed in the cabinet backplane, or a switch corresponding to any node is disposed in the any node. This simplifies wiring in the cabinet.

In another possible implementation, each of the M branch circuits includes a first branch and a second branch, the first branch and the second branch are oppositely disposed in a node where the branch circuit resides, and a gap exists between the first branch and the second branch. One end of the first branch is connected to the first trunk circuit, and one end of the second branch is connected to the second trunk circuit through a switch. In this way, when leakage occurs in the liquid cooling apparatus in the faulty node, the first branch and the second branch included in the branch circuit of the faulty node can connect the first trunk circuit and the second trunk circuit.

In another possible implementation, each branch circuit includes a water detection cable sensor, and the first branch and the second branch are two conducting wires of the water detection cable sensor.

In another possible implementation, nodes in the cabinet system are divided into a plurality of groups, there are a plurality of detection circuits, and each detection circuit corresponds to a group of nodes. The monitoring module is configured to use the plurality of detection circuits to monitor a leakage status of a liquid cooling apparatus in each node in the plurality of groups of nodes, and use a detection circuit corresponding to the any group of nodes to locate, when a faulty node with a leaking liquid cooling apparatus exists in any group of nodes, the node where the faulty liquid cooling apparatus resides in the any group of nodes. In this way, detection is performed on nodes in different groups.

According to a second aspect, this application provides a leakage detection method, where the method is applied to a cabinet system, the cabinet system includes at least one node, and each of the at least one node uses a liquid cooling apparatus for heat dissipation. In this method, a detection circuit is used to monitor a leakage status of a liquid cooling apparatus in each node included in the cabinet system, and locate, when detecting leakage in a liquid cooling apparatus in any node, a faulty node where the faulty liquid cooling apparatus resides. The faulty node where the leaking liquid cooling apparatus resides can be located by using the monitoring module and the detection circuit, which implements effective leakage detection.

In a possible implementation, M switches included in the detection circuit are controlled to be turned off, where M is an integer greater than 0. A switch is selected from the M switches, the selected switch is controlled to be turned on, and when a voltage signal is detected on a second trunk circuit included in the detection circuit, a node corresponding to the selected switch is determined as the faulty node. In this way, the faulty node is detected from M nodes by using the M switches.

According to a third aspect, this application provides a cabinet system, including a leakage detection apparatus, where the leakage detection apparatus is configured to perform the operation steps of the method according to the second aspect or any possible implementation of the second aspect.

According to a fourth aspect, this application provides a leakage detection apparatus. The apparatus includes a monitoring module and a detection circuit. The monitoring module is implemented by using an application-specific integrated circuit ASIC or a programmable logic device PLD. The detection circuit includes a first trunk circuit, a second trunk circuit, and M branch circuits, where M is an integer greater than 0, and the M branch circuits are respectively located in M nodes included in a cabinet system. One end of the first trunk circuit is connected to a power supply of the cabinet system, and the other end of the first trunk circuit is separately connected to each branch circuit. One end of the second trunk circuit is connected to the monitoring module, and the other end of the second trunk circuit is separately connected to a switch of each branch circuit. The M switches are in a turn-on state, and the M switches include a switch connected to each branch circuit. The monitoring module is configured to implement a function provided by the monitoring module in the first aspect or any possible implementation of the first aspect, and the detection circuit is configured to implement a function provided by the detection circuit in the first aspect or any possible implementation of the first aspect.

According to a fifth aspect, this application provides a cabinet system, where the cabinet system includes the leakage detection apparatus according to the first aspect or any possible implementation of the first aspect.

According to a sixth aspect, this application provides a computer-readable storage medium. The computer-readable storage medium stores program code. When the program code is run on a computer, the computer is enabled to perform the method in any one of the second aspect or the possible implementations of the second aspect.

According to a seventh aspect, this application provides a computer program product including program code. When the computer program product runs on a computer, the computer is enabled to perform the method in any one of the second aspect or the possible implementations of the second aspect.

According to an eighth aspect, this application provides a chip. The chip includes a memory and a processor. The memory is configured to store computer instructions, and the processor is configured to invoke the computer instructions from the memory and run the computer instructions, to perform the method in any one of the second aspect and the possible implementations of the second aspect.

In this application, based on the implementations according to the foregoing aspects, the implementations may be further combined to provide more implementations.

DESCRIPTION OF EMBODIMENTS

Figure 1:
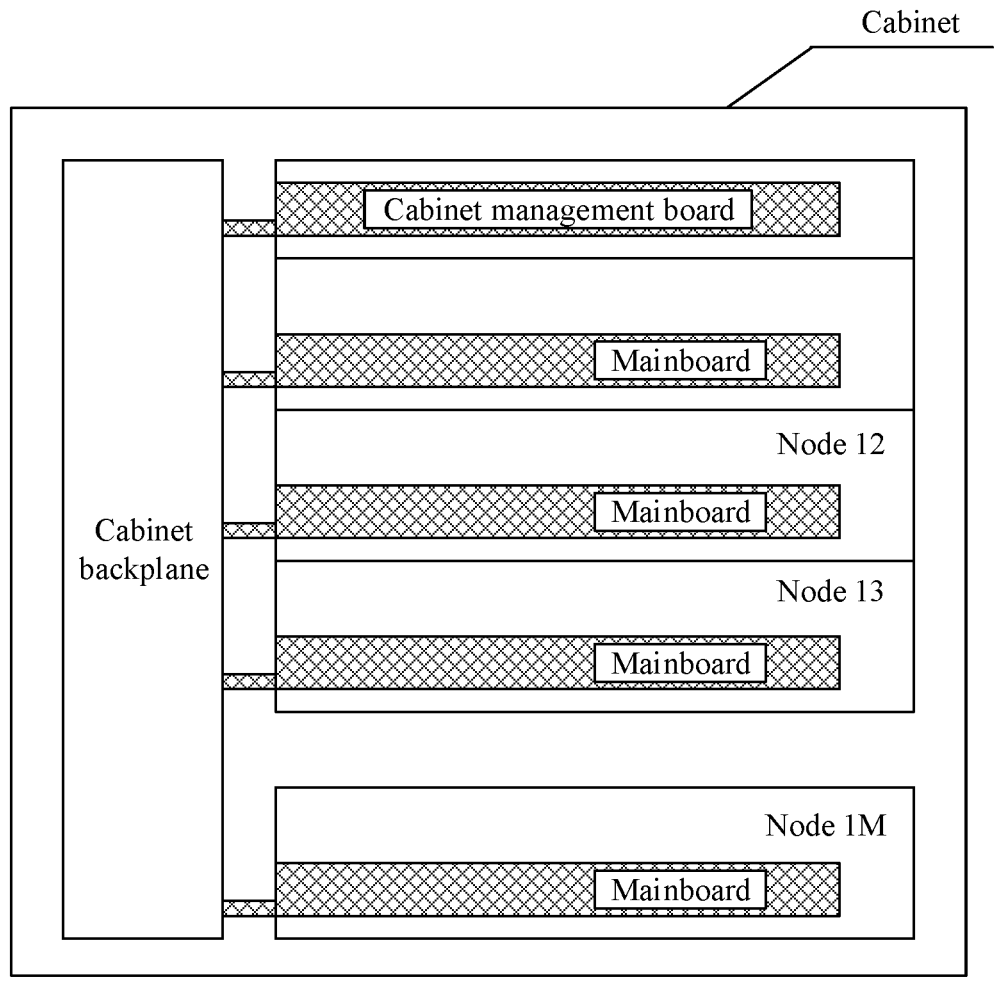
FIG. 1 is a schematic diagram of a structure of a cabinet according to an embodiment of this application.

Embodiments of this application provide a cabinet system. The cabinet system includes at least one node, and the node may be any type of device, including a server, a storage device, and the like. Refer to FIG. 1. Each cabinet includes a plurality of nodes (the cabinet shown in FIG. 1 includes a node 11, a node 12, a node 13, . . . ). For any cabinet, the cabinet further includes a cabinet backplane. Each node includes a mainboard, and the mainboard is connected to the cabinet backplane. In this way, for any node, a mainboard in the node can communicate with a mainboard in another node in the cabinet system through the cabinet backplane, or a mainboard in the node can communicate with a device outside the cabinet system through the cabinet backplane. The mainboard may also be referred to as a printed circuit board or a mother board (mother board). The cabinet backplane is connected to each node through a connector and implements signal interconnection between the nodes. Optionally, in addition to the case shown in FIG. 1, nodes in the cabinet system may alternatively be directly provided inside the cabinet system. That is, the nodes do not need to implement signal interconnection through the cabinet backplane, but may implement interconnection between them through a switching device in another form such as a switch. For ease of description, the following uses the cabinet system shown in FIG. 1 as an example to describe a leakage detection method provided in this application.

The mainboard of each node includes processing chips, such as a central processing unit (central processing unit, CPU). The processing chip generates a large amount of heat in a working process and requires heat dissipation. For heat dissipation, a main liquid inlet pipe and a main liquid outlet pipe (shown in the figure) are disposed on a side of the cabinet. The main liquid outlet pipe is connected to an inlet of a cooling apparatus, an outlet of the cooling apparatus is connected to the main liquid inlet pipe, and a pump is disposed on the main liquid inlet pipe. A liquid cooling apparatus is disposed in the node, and the liquid cooling apparatus includes a branch liquid inlet pipe, a branch liquid outlet pipe, and a liquid cooling cold plate (not shown in the figure) disposed on the processing chip. One end of the branch liquid inlet pipe is connected to the main liquid inlet pipe, and the other end of the branch liquid inlet pipe is connected to the liquid cooling cold plate. One end of the branch liquid outlet pipe is connected to the main liquid outlet pipe, and the other end of the branch liquid inlet pipe is connected to the liquid cooling cold plate.

The cooling apparatus cools liquid in the main liquid outlet pipe and sends the cooled liquid to the main liquid inlet pipe. The pump serves as a power system and enables the liquid to circulate in a loop formed by the cold plate, the pump, and the cooling apparatus, and sends a coolant output by the cooling apparatus to the liquid cooling cold plate by using the main liquid inlet pipe and the branch liquid inlet pipe. In the liquid cooling cold plate, the coolant exchanges heat with the processing chip, so as to dissipate heat for the processing chip and cool the processing chip.

Leakage may occur in the liquid cooling apparatus deployed in the node, with the coolant leaking from the liquid cooling apparatus. This may be because the mainboard of the node is damaged due to reasons such as conductivity or a short circuit. Therefore, when leakage occurs in the liquid cooling apparatus, timely detection of the leaking liquid cooling apparatus can avoid component damage caused by the leakage.

For example, when the cabinet is being deployed, a valve may be disposed on the branch liquid inlet pipe, and the valve is located outside the node. In this way, when leakage is detected in the liquid cooling apparatus in the node, the valve can be closed to prevent coolant from continuing to flow into the node, to prevent a large amount of coolant from leaking from the node.

To detect leakage, the cabinet system further includes a leakage detection apparatus. The apparatus is configured to monitor a leakage status of the liquid cooling apparatus in each node included in the cabinet system, and locate, when leakage occurs in the liquid cooling apparatus in any node, the faulty node where leakage occurs in the liquid cooling apparatus.

It should be understood that, in this application, a faulty node refers to a node with a leaking liquid cooling apparatus. For ease of description, in the following description of this application, a node with a faulty leaking apparatus is referred to as a faulty node.

The apparatus includes a water detection cable provided in each node. For any node, a water detection cable is disposed on a liquid cooling apparatus in the node. For example, the water detection cable may be wound around the liquid cooling apparatus, including a liquid cooling cold plate, a branch liquid inlet pipe, and a branch liquid outlet pipe. Alternatively, the node includes a water pan located below the liquid cooling apparatus, and the water detection cable is located in the water pan. In this way, liquid leaking from the liquid cooling apparatus passes through the water detection cable, and a resistance value of the water detection cable decreases. The apparatus detects the faulty node with the leaking liquid cooling apparatus based on a feature of the water detection cable. A detailed structure of the apparatus and a detailed process of locating a faulty node will be described in detail in subsequent embodiments, and are not described in detail here.

Optionally, the cabinet further includes a cabinet management board, where the cabinet management board is configured to manage the entire cabinet.

Optionally, the cabinet backplane is a signal backplane of a PCB structure, a cable backplane formed by cables, or the like.

Figure 2:
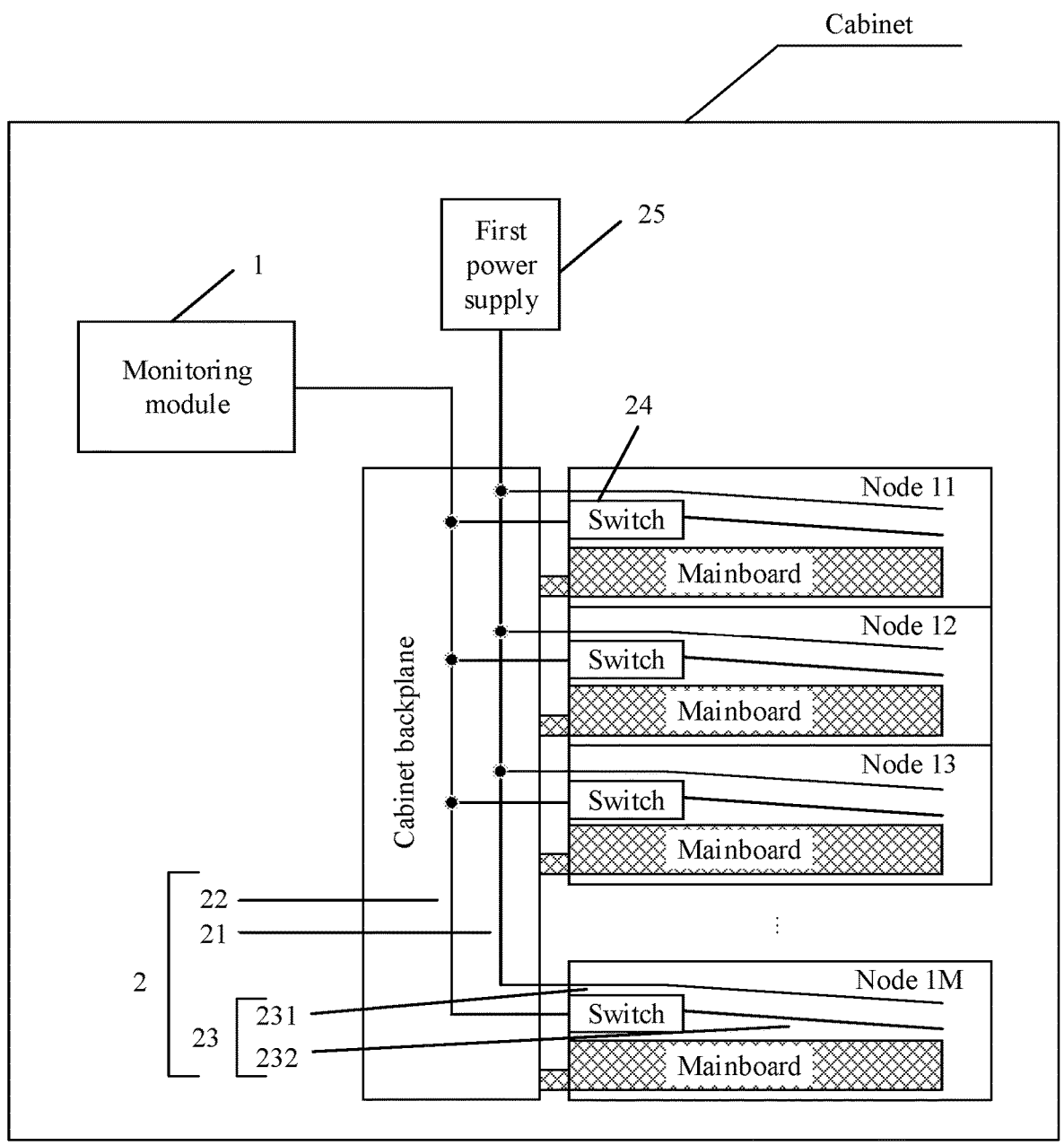
FIG. 2 is a schematic diagram of a structure of a cabinet system according to an embodiment of this application.

To detect a leaking liquid cooling apparatus, refer to FIG. 2. An embodiment of this application provides a leakage detection apparatus. The apparatus is applied to a cabinet system, the cabinet system includes at least one node, each of the at least one node uses a liquid cooling apparatus for heat dissipation, and the leakage detection apparatus includes:

a monitoring module 1, configured to monitor a leakage status of the liquid cooling apparatus in each node by using a circuit of each node, and use a detection circuit 2 to locate a faulty node when leakage occurs in a liquid cooling apparatus in any node; and the detection circuit 2, configured to connect to the monitoring module 1, and locate the faulty node when leakage occurs in the liquid cooling apparatus in any node.

The monitoring module 1 detects, by using the detection circuit 2, the faulty node where leakage occurs in the cabinet system, which implements effective leakage detection. In addition, the monitoring module 1 detects at least one node in the cabinet system by using the detection circuit 2. Only one monitoring module 1 is required used to implement detection on the at least one node, which reduces costs.

Figure 3:
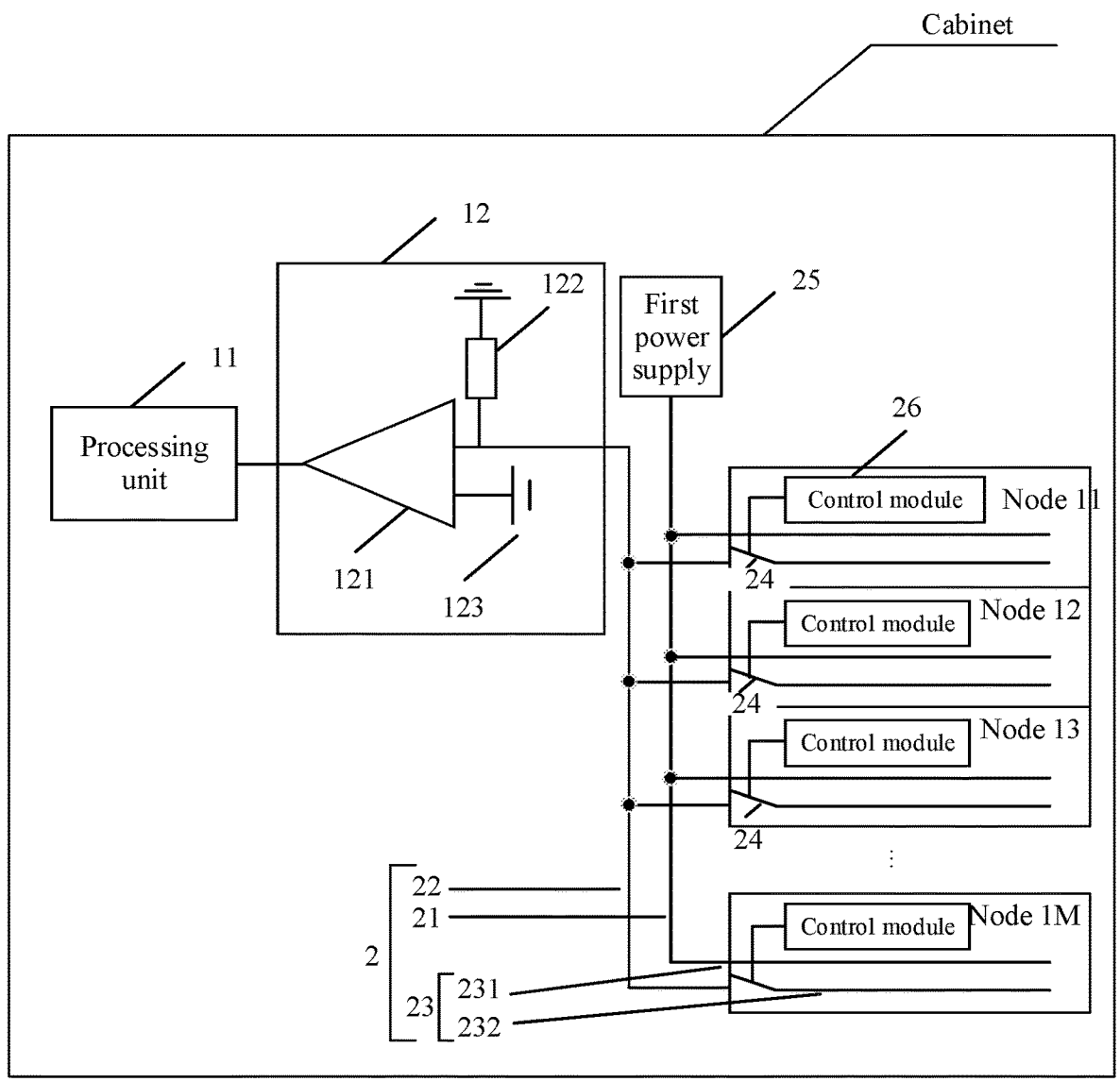
FIG. 3 is a schematic diagram of a structure of a leakage detection apparatus according to an embodiment of this application.

Refer to FIG. 3. FIG. 3 is a schematic structural diagram of a circuit in FIG. 2. In a possible embodiment, a detection circuit 2 includes a first trunk circuit 21, a second trunk circuit 22, and M branch circuits 23. The M branch circuits 23 are respectively located in M nodes included in a cabinet system, and M is an integer greater than 0. Each branch circuit 23 is connected to the first trunk circuit 21, and each branch circuit 23 is connected to the second trunk circuit 22 through a switch 24.

One end of the first trunk circuit 21 is connected to a first power supply 25 of the cabinet system, and one end of the second trunk circuit 22 is connected to a monitoring module 1. The monitoring module 1 is in communication connection with the M switches 24. The M switches 24 include a switch connected to each branch circuit 23, and the M switches 24 are in an initial turn-on state.

When liquid leaking from a liquid cooling apparatus in a faulty node passes through a branch circuit 23 in the faulty node, the branch circuit 23 in the faulty node is configured to connect the first trunk circuit 21 and the second trunk circuit 22.

The monitoring module 1 is configured to, when detecting a voltage signal on the second trunk circuit 22, detect the faulty node by controlling the M switches 24.

The branch circuit 23 in the node is configured to, when leakage occurs in the liquid cooling apparatus in the node, convert leakage into an impedance change of the branch, and send the impedance change to the first trunk circuit 21 and the second trunk circuit 22.

The first trunk circuit 21 is configured to connect the first power supply 25 and the M branch circuits 23, and the second trunk circuit 22 is configured to connect the monitoring module 1 and the M branch circuits 23. The first trunk circuit 21 and the second trunk circuit 22 are jointly configured to convert the impedance change of the branch circuit 23 into a voltage signal, and send the voltage signal to the monitoring module 1.

The monitoring module 1 may establish a communication connection to the switch 24 by using a communications protocol in a network of the cabinet system. For example, when the communications protocol is the Transmission Control Protocol (transmission control protocol, TCP), the monitoring module 1 establishes a TCP connection to the switch 24, and the monitoring module 1 sends a control command (for example, a turn-on command or a turn-off command) to the switch 24 by using the TCP connection, to control the switch 24 to be turned on or turned off.

Optionally, each branch circuit 23 is a water detection cable.

Optionally, the monitoring module 1 first controls the M switches 24 to be turned on, so that the M switches 24 are in an initial turn-on state. Then, when detecting a voltage signal on the second trunk circuit 22, the monitoring module 1 determines that there is a faulty node with a leaking liquid cooling apparatus, and detects the faulty node by controlling the M switches 24.

The monitoring module 1 detects the faulty node by controlling the M switches 24. In this way, only one monitoring module 1 is required to implement detection on M nodes, which reduces costs. In addition, the monitoring module 1 is connected to the second trunk circuit 22, and each branch circuit 23 is connected to the first trunk circuit 21 and the second trunk circuit 22. Therefore, a quantity of connected branch circuits 23 is not limited by a quantity of interfaces of the monitoring module 1, which improves scalability.

The M switches 24 are in a one-to-one correspondence with the M nodes, and a node corresponding to any one of the M switches 24 is a node where a branch circuit connected to the switch resides.

Refer to FIG. 3. Each switch 24 is in an initial turn-on state. Therefore, for any node, when leakage occurs in the liquid cooling apparatus in the node, liquid passes through the branch circuit 23, so that a resistance value of the branch circuit 23 decreases. The branch circuit 23 short-circuits the first trunk circuit 21 and the second trunk circuit 22, so that the first trunk circuit 21 is connected to the second trunk circuit 22. Because the first trunk circuit 21 is connected to the first power supply 25, there is an electrical connection between the second trunk circuit 22 and the first power supply 25. A voltage signal output by the first power supply 25 passes through the first trunk circuit 21, the branch circuit 23, and the second trunk circuit 22, so that the voltage signal exists on the second trunk circuit 22 and can be detected by the monitoring module 1.

Optionally, the monitoring module 1 is configured to, after detecting the voltage signal, control each switch 24 to be turned off, select a switch 24 from the M switches 24, control the selected switch 24 to be turned on, and when detecting a voltage signal on the second trunk circuit 22, determine that a node corresponding to the selected switch 24 is a faulty node with a leaking liquid cooling apparatus. Then, the monitoring module 1 turns on a next switch 24 based on a first preset rule and monitors whether a voltage signal exists on the second trunk circuit 22. The first preset rule may be randomly selecting any node to turn on a switch, or may be performing the foregoing process of turning on a switch and monitoring a voltage signal in a sequence of node IDs, so as to identify the faulty node.

It should be noted that, when the monitoring module 1 locates a faulty node, the process of turning on a switch and monitoring a voltage signal can be ended. In other words, in the process of turning on switches and monitoring voltage signals one by one, when the monitoring module 1 discovers a voltage signal in any node after the switch is turned on, the node is considered as a faulty node. In a possible embodiment, the monitoring module 1 may alternatively traverse all nodes to locate the faulty nodes.

Optionally, during implementation, after the monitoring module 1 controls each switch 24 to be turned off, the electrical connection between the second trunk circuit 22 and the first power supply 25 is accordingly disconnected. In this case, the voltage signal on the second trunk circuit 22 disappears. Then, the monitoring module 1 selects a first switch from the M switches 24, and controls the first switch to be turned on. If leakage occurs in a liquid cooling apparatus in a node corresponding to the first switch, a branch circuit corresponding to the first switch connects the first trunk circuit 21 and the second trunk circuit 22. A voltage signal output by the first power supply 25 passes through the first trunk circuit 21, the branch circuit corresponding to the first switch, and the second trunk circuit 22. The monitoring module 1 detects the voltage signal on the second trunk circuit 22, and determines that a node corresponding to the first switch is a faulty node with a leaking liquid cooling apparatus. If no leakage occurs in the liquid cooling apparatus in the node corresponding to the first switch, the first trunk circuit 21 and the second trunk circuit 22 are disconnected. The monitoring module 1 detects no voltage signal on the second trunk circuit 22, and determines that no leakage occurs in the liquid cooling apparatus in the node corresponding to the first switch.

After performing detection on the liquid cooling apparatus in the node corresponding to the first switch, the monitoring module 1 controls the first switch to be turned off, selects a second switch from the M switches 24, and repeats the foregoing process to detect whether a node corresponding to the second switch is a faulty node with a leaking liquid cooling apparatus, until detection on the M nodes is complete. The branch circuit 23 corresponding to the switch 24 is the branch circuit 23 connected to the switch 24.

Optionally, the monitoring module 1 stores a correspondence between switch IDs and node IDs. Any entry in the correspondence includes a node ID of one of the M nodes and a switch ID of a switch corresponding to the node. The monitoring module 1 selects a switch ID from the switch IDs included in the correspondence, that is, selects a switch, and controls a switch corresponding to the selected switch ID to be turned off. In this case, if the monitoring module 1 detects a voltage signal on the second trunk circuit 22, the monitoring module 1 obtains a corresponding node ID from the correspondence based on the selected switch ID, and determines that a node corresponding to the obtained node ID is a faulty node with a leaking liquid cooling apparatus.

Optionally, a switch ID of the switch 24 is an address of the switch 24, or the like.

Optionally, the monitoring module 1 and each switch 24 are connected to a network, and a communication connection is established between the monitoring module 1 and each switch 24 in the network.

Optionally, after performing detection on the M nodes, that is, after detecting each current faulty node, the monitoring module 1 further controls the M switches 24 to be turned on, so that when there is another faulty node with a leaking liquid cooling apparatus after the current time, the faulty node can be detected in time.

Optionally, the network is a management network of a cabinet system or a controller area network (controller area network, CAN) bus network of a cabinet system.

Optionally, when the M nodes are nodes in a plurality of cabinets, the network is formed by CAN bus networks of the plurality of cabinets. In this case, the CAN bus networks of the plurality of cabinets need to be connected as a whole, so that a communication connection can be established between the monitoring module 1 and each switch 24.

In a possible embodiment, refer to FIG. 3. The monitoring module 1 includes a processing module 11 and a voltage detection module 12. An input end of the voltage detection module 12 is connected to the detection circuit 2, and an output end is connected to the processing module 11.

The voltage detection module 12 is configured to, when detecting a voltage signal on the detection circuit 2, determine that there is a faulty node with a leaking liquid cooling apparatus, and send an indication signal to the processing module 11.

The processing module 11 is configured to receive the indication signal and locate the faulty node by using the detection circuit 2.

Optionally, the processing module 11 may be implemented by using an application-specific integrated circuit (application-specific integrated circuit, ASIC) or a programmable logic device (programmable logic device, PLD). The PLD may be a complex programmable logic device (complex programmable logical device, CPLD), a field-programmable gate array (field-programmable gate array, FPGA), generic array logic (generic array logic, GAL), or any combination thereof. Alternatively, the processing module 11 may be a microcontroller unit (microcontroller unit, MCU), a CPU, a single-chip microcomputer, or the like.

Optionally, the processing module 11 may be integrated in a cabinet management board of the cabinet. For example, the processing module 11 may be an existing component in the cabinet management board, so that the component in the cabinet management board can be reused to reduce hardware costs.

Optionally, the voltage detection module 12 may be integrated in the cabinet management board of the cabinet. For example, the voltage detection module 12 may be an existing component in the cabinet management board, so that the component in the cabinet management board can be reused to reduce hardware costs.

Optionally, an output end of the voltage detection module 12 is connected to an interface of the processing module 11. The interface of the processing module 11 may be a pin or the like of the processing module 11.

In a possible embodiment, refer to FIG. 3. An input end of the voltage detection module 12 is connected to an end of the second trunk circuit 22, and the output end is connected to the processing module 11.

The voltage detection module 12 is configured to detect whether a voltage signal exists on the second trunk circuit 22, and send an indication signal to the processing module 11 when detecting the voltage signal.

The processing module 11 is configured to receive the indication signal and determine that the voltage signal exists on the second trunk circuit 22.

Optionally, the indication signal is a square wave signal, a digital signal, or the like.

Optionally, in this embodiment, a process of detecting a faulty node is as follows: When receiving the indication signal for the first time, the processing module 11 determines that there is a faulty node with a leaking liquid cooling apparatus, and controls each switch 24 to be turned off. In this case, the voltage detection module 12 detects no voltage signal on the second trunk circuit 22, and stops sending the indication signal to the processing module 11. The processing module 11 selects a switch from the M switches 24, and controls the selected switch to be turned on.

If leakage occurs in the liquid cooling apparatus in the node corresponding to the selected switch, a branch circuit corresponding to the selected switch connects the first trunk circuit 21 and the second trunk circuit 22. In this case, a voltage signal output by the first power source 25 passes through the first trunk circuit 21, the branch circuit corresponding to the selected switch, and the second trunk circuit 22, and flows into the voltage detection module 12. The voltage detection module 12 receives the voltage signal, and sends an indication signal to the processing module 11. The processing module 11 receives the indication signal, and determines that the node corresponding to the selected switch is the faulty node with the leaking liquid cooling apparatus.

If no leakage occurs in the liquid cooling apparatus in the node corresponding to the selected switch, the first trunk circuit 21 and the second trunk circuit 22 are still disconnected, and no voltage signal exists on the second trunk circuit 22. In this case, the voltage detection module 12 does not send an indication signal to the processing module 11, and the processing module 11 determines that no leakage occurs in the liquid cooling apparatus in the node corresponding to the selected switch.

After performing detection on the node corresponding to the selected switch, the processing module 11 selects another switch from unselected switches, and repeats the foregoing process until detection on the M nodes is complete.

Optionally, the voltage detection module 12 is an analog-to-digital converter (analog-to-digital converter, ADC). The ADC receives a voltage signal from the second trunk circuit 22, and converts the voltage signal into a digital signal.

In a possible embodiment, refer to FIG. 3. The voltage detection module 12 includes a voltage comparator 121 and a resistor 122.

One end of the second trunk circuit 22 is connected to a first input end of the voltage comparator 121 and one end of the resistor 122, a second input end of the voltage comparator 121 is connected to a second power supply 123 included in the cabinet system, an output end is connected to the processing module 11, and the other end of the resistor 122 is grounded.

The voltage comparator 121 is configured to compare a voltage of the voltage signal on the second trunk circuit 22 with a voltage of a standard voltage signal output by the second power supply 123, and send a square wave signal to the processing module 11 when the voltage of the voltage signal is greater than the voltage of the standard voltage signal.

The processing module 11 is configured to receive the square wave signal and determine that the voltage signal exists on the second trunk circuit 22.

In this embodiment, a process of detecting a faulty node is as follows: If leakage occurs in a liquid cooling apparatus in a node, a branch circuit 23 in the node is caused to connect the first trunk circuit 21 and the second trunk circuit 22. In this case, a voltage signal output by the first power source 25 passes through the first trunk circuit 21, the branch circuit 23 of the node, the second trunk circuit 22, and the resistor 122, and flows into a grounding terminal. The voltage comparator 121 receives the voltage signal from the first input end, compares a voltage of the voltage signal with a voltage of the standard voltage signal output by the second power supply 123, and sends the square wave signal to the processing module 11 when the voltage of the voltage signal is greater than the voltage of the standard voltage signal. The processing module 11 receives the square wave signal for the first time and determines that the voltage signal exists on the second trunk circuit 22.

After determining that the voltage signal exists on the second trunk circuit 22, the processing module 11 may determine that leakage occurs in a liquid cooling apparatus in a node. Then, the processing module 11 controls each switch 24 to be turned off. In this case, the electrical connection between the second trunk circuit 22 and the first power supply 25 is disconnected, and no voltage signal exists on the second trunk circuit 22. Therefore, the voltage comparator 121 stops sending the square wave signal to the processing module 11.

The processing module 11 selects a switch from the M switches 24, and controls the selected switch to be turned on. If leakage occurs in the liquid cooling apparatus in the node corresponding to the selected switch, the branch circuit corresponding to the selected switch connects the first trunk circuit 21 and the second trunk circuit 22. In this case, a voltage signal output by the first power source 25 passes through the first trunk circuit 21, the branch circuit corresponding to the selected switch, the second trunk circuit 22, and the resistor 122, and flows into the grounding terminal. The voltage comparator 121 receives the voltage signal from the first input end, compares a voltage of the voltage signal with a voltage of the standard voltage signal output by the second power supply 123, and sends the square wave signal to the processing module 11 when the voltage of the voltage signal is greater than the voltage of the standard voltage signal. The processing module 11 receives the square wave signal, and determines that the node corresponding to the selected switch is the faulty node with the leaking liquid cooling apparatus.

If no leakage occurs in the liquid cooling apparatus in the node corresponding to the selected switch, the first trunk circuit 21 and the second trunk circuit 22 are still disconnected, and no voltage signal exists on the second trunk circuit 22. In this case, the voltage comparator 121 does not send the square wave signal to the processing module 11, and the processing module 11 determines that no leakage occurs in the liquid cooling apparatus in the node corresponding to the selected switch.

After performing detection on the node corresponding to the selected switch, the processing module 11 selects another switch from unselected switches, and repeats the foregoing process until detection on the M nodes is complete.

The processing module 11 needs the voltage detection module 12 to detect whether the voltage signal exists on the second trunk circuit 22. When the voltage detection module 12 detects, for the first time, that the voltage signal exists on the second trunk circuit 22, the processing module 11 may determine that leakage occurs in the liquid cooling apparatus in the node. The processing module 11 selects a switch, and selects one switch each time. The processing module 11 controls the selected switch to be turned on and other unselected switches to remain turned off. The processing module 11 determines, based on a result of detecting the second trunk circuit 22 by the voltage detection module 12, whether leakage occurs in the liquid cooling apparatus in the node corresponding to the selected switch. Therefore, the processing module 11 performs detection on the liquid cooling apparatuses in the M nodes by using one voltage detection module 12, eliminating a need of M−1 voltage detection modules 12. This not only reduces costs, but also reduces occupation of interfaces of the processing module 21.

Optionally, refer to FIG. 2 and FIG. 3. For any one of the M branch circuits 23, the branch circuit 23 includes a first branch 231 and a second branch 232. The first branch 231 and the second branch 232 are oppositely disposed in the node where the branch circuit 23 resides, and a gap exists between the first branch 231 and the second branch 232.

One end of the first branch 231 is connected to the first trunk circuit 21, and one end of the second branch 232 is connected to the second trunk circuit 22 through the switch 24.

For the first branch 231 and the second branch 232 in the node, the first branch 231 and the second branch 232 are jointly configured to convert a leakage status into an impedance change between the first branch 231 and the second branch 232, and send the impedance change to the first trunk circuit 21 and the second trunk circuit 22.

The first branch 231 and the second branch 232 included in the branch circuit 23 may be disposed in the liquid cooling apparatus in the node where the branch circuit 23 resides, for example, may be wound around the liquid cooling apparatus in the node. Alternatively, a water pan is disposed in the node. The water pan is located below the liquid cooling apparatus and is configured to receive liquid leaking from the liquid cooling apparatus. The first branch 231 and the second branch 232 included in the branch circuit 23 may be disposed in the water pan. This ensures that liquid leaking from the liquid cooling apparatus passes through the first branch 231 and the second branch 232 included in the branch circuit 23, and connects the first branch 231 and the second branch 232.

Because the first branch 231 is connected to the first trunk circuit 21, and the second branch 232 is connected to the second trunk circuit 22 through the switch 24, the first trunk circuit 21 and the second trunk circuit 22 are accordingly connected when the first branch 231 and the second branch 232 are connected.

The liquid cooling apparatus in the node includes a liquid cooling cold plate, a branch liquid inlet pipe, and a branch liquid outlet pipe. Therefore, the first branch 231 and the second branch 232 included in the branch circuit 23 are disposed in the liquid cooling cold plate, the branch liquid inlet pipe, and the branch liquid outlet pipe. Or, the first branch 231 and the second branch 232 included in the branch circuit 23 are disposed in the water pan below the liquid cooling cold plate, the branch liquid inlet pipe, and the branch liquid outlet pipe.

Optionally, for any branch circuit 23, the branch circuit 23 is the foregoing water detection cable, and the first branch 231 and the second branch 232 are two conducting wires in the water detection cable. For example, the water detection cable may be a water detection cable sensor, and the first branch 231 and the second branch 232 are two conducting wires of the water detection cable sensor. When liquid passes through the water detection cable sensor, a resistance value between the two conducting wires in the water detection cable sensor decreases.

The water detection cable sensor includes two conducting wires and a fabric material with good water absorption performance. When the water detection cable sensor is being manufactured, the two conducting wires are wound in parallel and woven into the fabric material. The two conducting wires are separated by the fabric material, so that the two conducting wires do not overlap. The resistance between the two wires is about tens of mega ohms.

When liquid infiltrates a surface of the water detection cable sensor, adsorption of the water absorbing material immediately decreases the resistance between the two conducting wires (usually to a few thousand ohms), so that the two conducting wires connect the first trunk circuit 21 and the second trunk circuit 22.

In a possible embodiment, refer to FIG. 3. The apparatus further includes M control modules 26. The M control modules 26 are separately located in the M nodes, and the M control modules 26 are in communication connections with the monitoring module 1. Each control module 26 in the M nodes is connected to a control end of the switch 24 corresponding to each node.

In this way, in this embodiment, a process of detecting a faulty node may be as follows: When detecting a voltage signal on the second trunk circuit 22, the monitoring module 1 determines that leakage occurs in a liquid cooling apparatus in a node, and sends a turn-off command to the M control modules 26. Any one of the M control modules 26 receives the turn-off command, and controls a switch 24 connected to the control module 26 to be turned off. In this way, each switch 24 is turned off, and the voltage signal on the second trunk circuit 22 disappears.

The monitoring module 1 selects a control module from the M control modules 26, and sends a turn-on command to the selected control module. The selected control module receives the turn-on command and controls a switch connected to the selected control module to be turned on. If the monitoring module 1 detects a voltage signal on the second trunk circuit 22, the monitoring module 1 determines that the node where the selected control module resides is the faulty node with a leaking liquid cooling apparatus. If the monitoring module 1 detects no voltage signal on the second trunk circuit 22, the monitoring module 1 determines that no leakage occurs in the liquid cooling apparatus in the node where the selected control module resides.

Then, the monitoring module 1 sends a turn-off command to the selected control module, and the selected control module receives the turn-off command and controls the switch connected to the selected control module to be turned off. The monitoring module 1 selects a control module from unselected control modules in the M control modules, and then continues to perform the foregoing detection process until detection on the nodes is complete.

Optionally, the monitoring module 1 and the M control modules 26 are connected to a network, and a communication connection is established between the monitoring module 1 and each control module 26 in the network.

Optionally, for the control module 26 in any node, the control module 26 is a baseboard management controller (baseboard management controller, BMC) or a single-chip microcomputer included in the node. The BMC or the single-chip microcomputer is integrated into a mainboard of the node, and is an existing component in the mainboard. In this way, the existing component in the mainboard can be reused, without the need to separately adding the M control modules 26, which further reduces costs.

In a possible embodiment, refer to FIG. 3. The processing module 11 and the M control modules 26 are connected to a network, and a communication connection is established between the processing module 11 and each control module 26 in the network.

In this way, when determining that leakage occurs in a liquid cooling apparatus in a node, the processing module 11 sends a turn-off command to the M control modules 26, selects a control module from the M control modules 26, and sends a turn-on command to the selected control module. After sending the turn-on command, if the processing module 11 receives an indication signal sent by the voltage detection module 12, the processing module 11 determines that the node where the selected control module resides is the faulty node with a leaking liquid cooling apparatus. If the processing module 11 does not receive the indication signal sent by the voltage detection module 12, the processing module 11 determines that no leakage occurs in the liquid cooling apparatus in the node where the selected control module resides.

Optionally, the processing module 11 stores a correspondence between module IDs and node IDs. Any entry in the correspondence includes a module ID of one of the M control modules and a node ID of a node where the control module resides. The processing module 11 selects a module ID from the module IDs included in the correspondence, and sends a turn-on command to a control module corresponding to the selected module ID. If receiving an indication signal sent by the voltage detection module 12, the processing module 11 obtains a corresponding node ID from the correspondence based on the selected module ID, and determines that a node corresponding to the obtained node ID is a faulty node with a leaking liquid cooling apparatus.

A module ID of the control module 26 is an address of the control module 26, or the like.

Optionally, the first trunk circuit 21 and the second trunk circuit 22 are located in a cabinet backplane of the cabinet.

In a case in which the cabinet backplane is a signal backplane of a PCB structure, the first trunk circuit 21 and the second trunk circuit 22 are PCB cables in the signal backplane. In a case in which the cabinet backplane is a cable backplane formed by cables, the first trunk circuit 21 and the second trunk circuit 22 are two cables in the cable backplane.

Optionally, when the M nodes are nodes in a plurality of cabinets, the first trunk circuit 21 is divided into a plurality of segments. The cabinet backplane of each cabinet includes a segment of trunk circuit, and the segment of trunk circuit in the cabinet backplane of each cabinet is connected in series to form one trunk circuit, to obtain the first trunk circuit 21. Likewise, the second trunk circuit 22 is divided into a plurality of segments. The cabinet backplane of each cabinet includes a segment of trunk circuit, and the segment of trunk circuit in the cabinet backplane of each cabinet is connected in series to form one trunk circuit, to obtain the second trunk circuit 22.

Because the first trunk circuit 21 and the second trunk circuit 22 are PCB cables in the signal backplane or two cables in the cable backplane, existing components in the cabinet are reused in this way, which saves hardware and further reduces costs.

Optionally, for a switch 24 corresponding to a branch circuit 23 in any node, the switch 24 may be a switch circuit, a metal-oxide-semiconductor field-effect transistor (metal-oxide-semiconductor field-effect transistor, MOS), or the like.

Optionally, the switch 24 is disposed in the cabinet backplane, and the switch 24 may be plug-connected to the branch circuit 23 in the node. Alternatively, the switch 24 is disposed in the node, for example, the switch 23 may be integrated in a mainboard of the node. Alternatively, the switch 23 is disposed in a separate PCB.

In a possible embodiment, nodes in the cabinet system are grouped into a plurality of groups based on factors such as locations of the nodes in the cabinet system or services provided by the nodes. For example, nodes in a same cabinet may be grouped into a group, or nodes in several adjacent cabinets may be grouped into a group. Alternatively, nodes in a same cabinet are divided into a plurality of groups, and a plurality of nodes in adjacent positions in the cabinet are grouped into a group. For another example, nodes that provide the same service may be grouped into a group. Then, detection is performed on liquid cooling apparatuses in the nodes by group. For example, in specific implementation, each group of nodes corresponds to a detection circuit 2, and the detection circuit 2 corresponding to each group of nodes is connected to the monitoring module 1. For example, refer to FIG. 4. The M nodes belong to a first group of nodes. The cabinet system further includes a second group of nodes, and the second group of nodes include N nodes, for example, nodes 21, 22, . . . , and 2N in FIG. 4, where N is an integer greater than 0.

Figure 4:
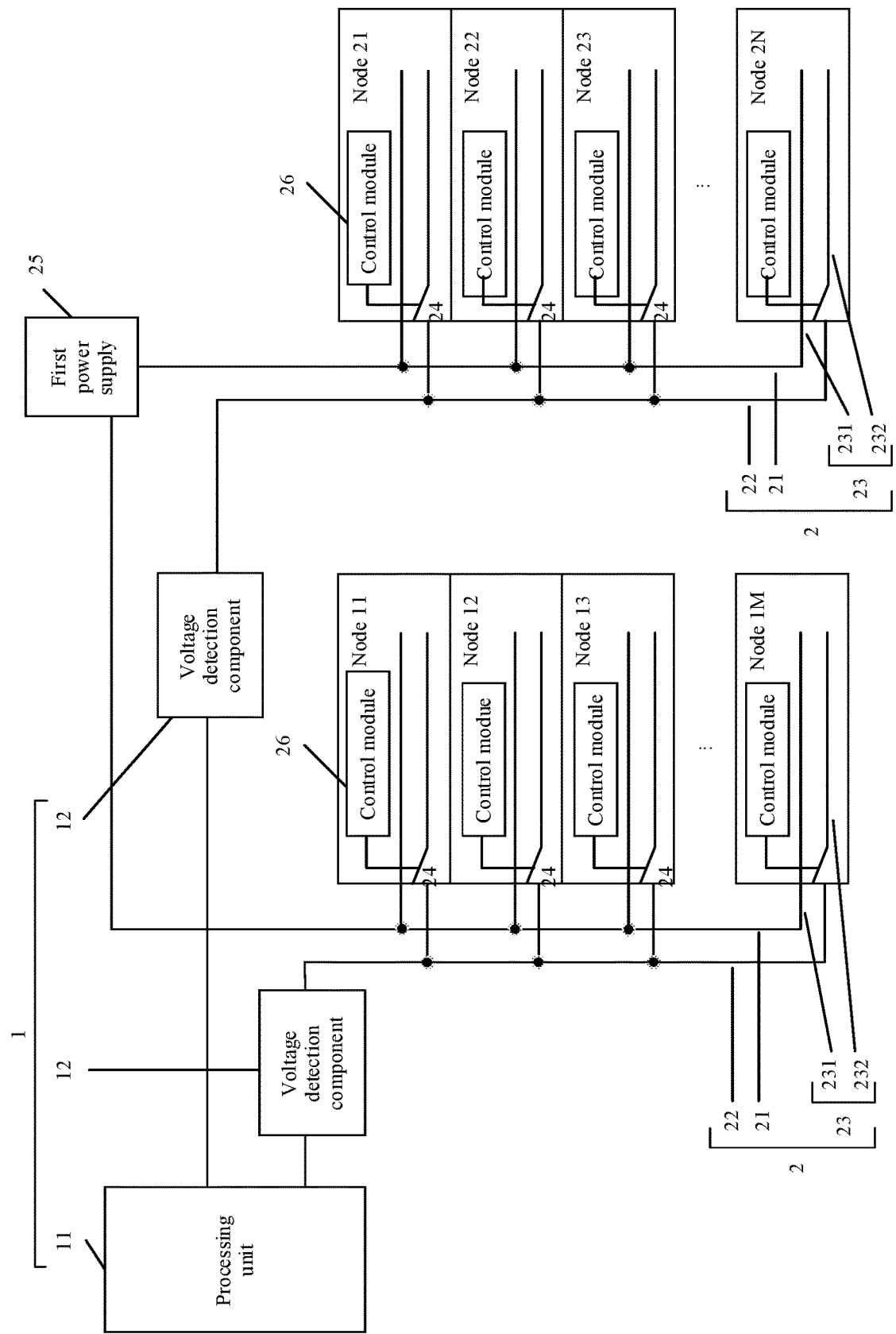
FIG. 4 is a schematic diagram of a structure of another leakage detection apparatus according to an embodiment of this application.

Refer to FIG. 4. Both a detection circuit 2 corresponding to the first group of nodes and a detection circuit 2 corresponding to the second group of nodes are connected to the monitoring module 1. In this way, the monitoring module 1 is configured to use the detection circuit 2 to detect, when detecting a voltage signal on any detection circuit 2, a faulty node with a leaking liquid cooling apparatus from the group of nodes corresponding to the detection circuit 2.

In a possible embodiment, the second trunk circuit 22 included in each detection circuit 2 is connected to the monitoring module 1, and each detection circuit 2 corresponds to a group of switches. In this embodiment, the process of detecting the faulty node may be: When detecting a voltage signal on the second trunk circuit 22 included in any detection circuit 2, the monitoring module 1 controls each switch 24 in the group of switches corresponding to the detection circuit 2 to be turned off. In this case, the second trunk circuit 22 included in the detection circuit 2 is electrically disconnected from the first power supply 25, and the voltage signal on the second trunk circuit 22 included in the detection circuit 2 disappears. Then, the monitoring module 1 selects a switch from the group of switches corresponding to the detection circuit 2, and controls the selected switch to be turned on. If leakage occurs in a liquid cooling apparatus in a node corresponding to the selected switch, a branch circuit corresponding to the selected switch connects the first trunk circuit 21 and the second trunk circuit 22 included in the detection circuit 2. A voltage signal output by the first power supply 25 passes through the first trunk circuit 21, the branch circuit corresponding to the selected switch, and the second trunk circuit 22. The monitoring module 1 detects the voltage signal on the second trunk circuit 22, and determines that the node corresponding to the selected switch is a faulty node with a leaking liquid cooling apparatus. If no leakage occurs in the liquid cooling apparatus in the node corresponding to the selected switch, the first trunk circuit 21 and the second trunk circuit 22 are disconnected. The monitoring module 1 detects no voltage signal on the second trunk circuit 22, and determines that no leakage occurs in the liquid cooling apparatus in the node corresponding to the selected switch.

After performing detection on the node corresponding to the selected switch, the monitoring module 1 controls the selected switch to be turned off, selects a switch from unselected switches included in the group of switches corresponding to the detection circuit 2, and repeats the foregoing process, until detection on the liquid cooling apparatus in each node included in the group of nodes corresponding to the detection circuit 2 is complete.

In a possible embodiment, refer to FIG. 4. The monitoring module 1 includes a processing module 11 and a plurality of voltage detection modules 12. An input end of each voltage detection module 12 is connected to an end of a second trunk circuit 22 included in a detection circuit 2, and an output end is connected to the processing module 11.

Optionally, the voltage detection modules 12 are separately connected to different interfaces of the processing module 11. In this way, different interfaces correspond to different groups of switches and different groups of nodes. Therefore, in this embodiment, a process of detecting a faulty node with a leaking liquid cooling apparatus may be as follows:

When the processing module 11 receives, from an interface for the first time, an indication signal sent by a voltage detection module 12, the processing module 11 determines a group of switches corresponding to the interface, and controls each switch in the group of switches to be turned off. Then the processing module 11 selects a switch from the group of switches, and controls the selected switch to be turned on. If the processing module 11 receives, from the interface, an indication signal sent by the voltage detection module 12, the processing module 11 determines that a node corresponding to the selected switch is a faulty node with a leaking liquid cooling apparatus. If the processing module 11 does not receive an indication signal sent by the voltage detection module 12, the processing module 11 determines that no leakage occurs in the liquid cooling apparatus in the node corresponding to the selected switch. The processing module 11 controls the selected switch to be turned off, selects a switch from unselected switches included in the group of switches, and performs the foregoing process until each switch in the group of switches is selected.

Optionally, the processing module 11 stores a correspondence between interface IDs, switch IDs, and node IDs. Any entry in the correspondence includes an interface ID of an interface, a switch ID of each switch in a group of switches corresponding to the interface, and a node ID of each node in a group of nodes corresponding to the interface.

Optionally, in this embodiment, the process of detecting a faulty node may be specifically as follows: When the processing module 11 receives, from an interface, an indication signal sent by a voltage detection module 12, the processing module 11 obtains a group of switch IDs corresponding to the interface from the correspondence based on an interface ID of the interface. The processing module 11 controls a switch corresponding to each switch ID in the group of switch IDs to be turned off, selects a switch ID from the group of switch IDs, and controls a switch corresponding to the selected switch ID to be turned on. If the processing module 11 receives, from the interface, the indication signal sent by the voltage detection module 12, the processing module 11 obtains a corresponding node ID from the correspondence based on the interface ID of the interface and the selected switch ID, and determines that a node corresponding to the obtained node ID is the faulty node with a leaking liquid cooling apparatus. If the processing module 11 does not receive, from the interface, the indication signal sent by the voltage detection module 12, the processing module 11 determines that no leakage occurs in the liquid cooling apparatus in the node corresponding to the selected switch. The processing module 11 controls the switch corresponding to the selected switch ID to be turned off, selects a switch ID from unselected switch IDs included in the group of switch IDs, and continues to perform the foregoing process on the selected switch ID until each switch ID in the group of switch IDs is selected.

In a possible embodiment, refer to FIG. 4. Each detection circuit 2 corresponds to a group of control modules. For any detection circuit 2, each control module 26 included in a group of control modules corresponding to the detection circuit 2 is separately located in a group of nodes corresponding to the detection circuit 2. Any control module 26 in the group of control modules is connected to a switch 24 in a group of switches corresponding to the detection circuit 2, and the group of control modules further corresponds to an interface in the processing module 11. In this embodiment, a process of detecting a faulty node may be as follows:

When the processing module 11 receives, from an interface for the first time, an indication signal sent by a voltage detection module 12, the processing module 11 determines a group of control modules corresponding to the interface, and sends a turn-off command to each control module in the group of control modules. Any control module in the group of control modules receives the turn-off command, and controls a switch connected to the control module to be turned off. In this way, each switch in the group of switches corresponding to the interface is turned off. Then, the processing module 11 selects a control module from the group of control modules, and sends a turn-on command to the selected control module. The selected control module receives the turn-on command, and controls a switch connected to the selected control module to be turned on. If the processing module 11 receives, from the interface, an indication signal sent by the voltage detection module 12, the processing module 11 determines that a node where the selected control module resides is a faulty node with a leaking liquid cooling apparatus. If the processing module 11 does not receive the indication signal sent by the voltage detection module 12, the processing module 11 determines that no leakage occurs in the liquid cooling apparatus in the node where the selected control module resides.

Then, the processing module 11 sends a turn-off command to the selected control module, and the selected control module receives the turn-off command and controls the switch connected to the selected control module to be turned off. The processing module 11 then selects a control module from unselected control modules included in the group of control modules, and performs the foregoing process until each control module in the group of control modules is selected.

Optionally, a correspondence between interface IDs, switch IDs, and node IDs stored by the processing module 11 may be a correspondence between interface IDs, module IDs, and node IDs. Any entry in the correspondence includes an interface ID of an interface, a module ID of each control module in a group of control modules corresponding to the interface, and a node ID of each node in a group of nodes corresponding to the interface.

In this case, the process of detecting a faulty node may be specifically as follows: When the processing module 11 receives, from an interface, an indication signal sent by a voltage detection module 12, the processing module 11 obtains module IDs of a group of control modules corresponding to the interface from the correspondence based on an interface ID of the interface. The processing module 11 sends a turn-off command to each control module in the group of control modules based on the module IDs of the group of control modules, so that each control module turns off a switch connected to the control module. The processing module 11 selects a module ID from the module IDs of the group of control modules, and sends a turn-on command to a control module corresponding to the selected module ID, so that the control module controls a switch connected to the control module to be turned on. In this case, if the processing module 11 receives, from the interface, the indication signal sent by the voltage detection module 12, the processing module 11 obtains a corresponding node ID from the correspondence based on the interface ID of the interface and the selected module ID, and determines that a node corresponding to the obtained node ID is a faulty node with a leaking liquid cooling apparatus. If the processing module 11 does not receive, from the interface, the indication signal sent by the voltage detection module 12, the processing module 11 determines that no leakage occurs in the liquid cooling apparatus in the node where the control module resides.

The processing module 11 sends a turn-off command to a control module corresponding to the selected module ID, so that the control module controls a switch connected to the control module to be turned off. Then, the processing module 11 selects a module ID from unselected module IDs included in the group of module IDs, and continues to perform the foregoing process on the selected module ID until each module ID in the group of module IDs is selected.

Optionally, when detecting the faulty node, the monitoring module 1 may send a notification message to a management device, where the notification message includes a node ID of the faulty node. In this way, the management device receives the notification message, and displays the node ID of the faulty node, so that a technician can maintain or replace the liquid cooling apparatus in the node corresponding to the faulty node ID.

In this embodiment of this application, each branch circuit is connected to the first trunk circuit, and each branch circuit is connected to the second trunk circuit through a switch. One end of the first trunk circuit is connected to the first power supply, and one end of the second trunk circuit is connected to the monitoring module. The monitoring module is in communication connection with the M switches, and the M switches are in an initial turn-on state. In this way, when liquid leaking from the liquid cooling apparatus in the faulty node passes through a branch circuit in the faulty node, the branch circuit in the faulty node connects the first trunk circuit and the second trunk circuit, so that when a voltage signal is detected on the second trunk circuit, the faulty node can be detected by controlling the M switches. This implements effective detection of leakage. In addition, only one monitoring module is required to detect liquid cooling apparatuses in different nodes, which reduces detection costs. The following further describes a leakage detection method provided in this application with reference to FIG. 5.

Figure 5:
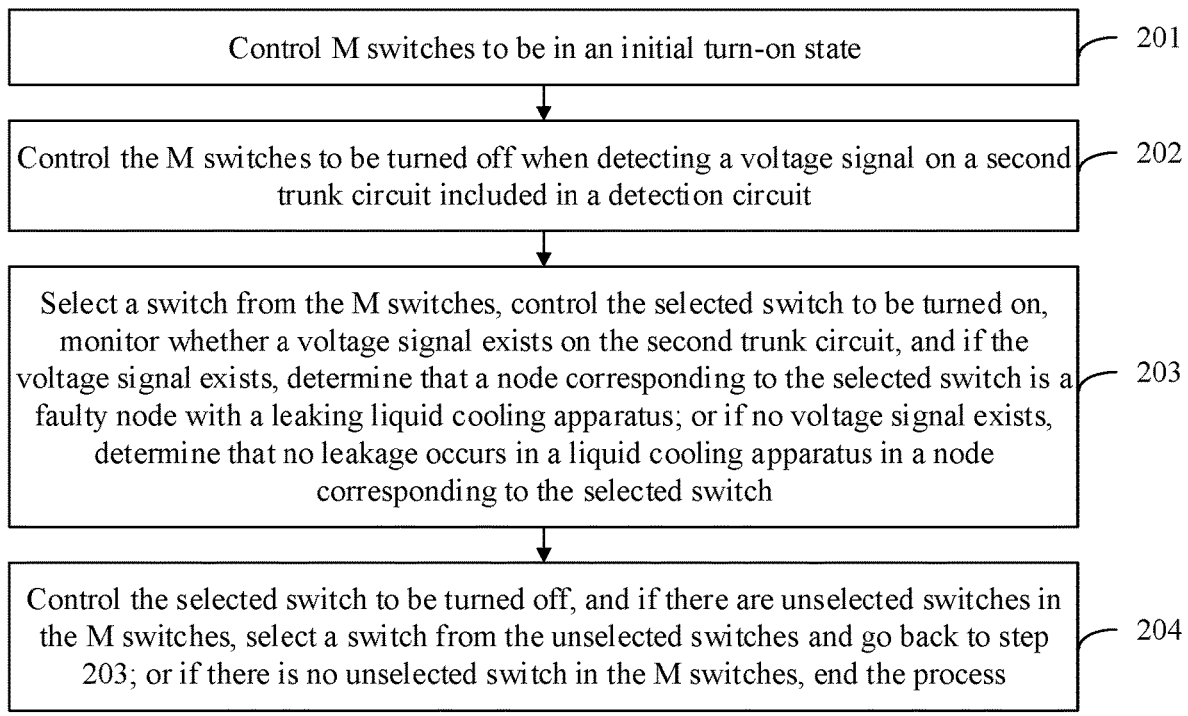
FIG. 5 is a flowchart of a leakage detection method according to an embodiment of this application.

Refer to FIG. 5. An embodiment of this application provides a leakage detection method. The method is applied to the apparatus shown in FIG. 2 to FIG. 4. The method is performed by a monitoring module included in the apparatus, and may be specifically performed by a processing module in the monitoring module. The method includes the following steps:

Step 201: Control M switches to be in an initial turn-on state.

In this step, a turn-on command is sent to M control modules. For any control module, after receiving the turn-on command, the control module controls a switch connected to the control module to be turned on.

Optionally, a correspondence between control module IDs and node IDs is stored in advance. Module IDs of the M control modules may be obtained from the correspondence between control module IDs and node IDs, and the turn-on command is sent to each control module based on the module ID of each control module.

Step 202: Control the M switches to be turned off when a voltage signal is detected on a second trunk circuit included in a detection circuit.

In this step, a turn-off command is sent to the M control modules. For any control module, after receiving the turn-off command, the control module controls a switch connected to the control module to be turned off.

Optionally, the module IDs of the M control modules may be obtained from the correspondence between control module IDs and node IDs, and the turn-off command is sent to each control module based on the module ID of each control module.

Step 203: Select a switch from the M switches, control the selected switch to be turned on, and monitor whether a voltage signal exists on the second trunk circuit. If a voltage signal exists, determine that a node corresponding to the selected switch is a faulty node with a leaking liquid cooling apparatus; or if no voltage signal exists, determine that no leakage occurs in the liquid cooling apparatus in the node corresponding to the selected switch.

In this step, the module IDs of the M control modules may be obtained from the correspondence between control module IDs and node IDs, a module ID of one control module may be selected from the module IDs of the M control modules, to implement selection of a switch connected to the control module, and the turn-on command may be sent to the control module based on the module ID of the control module. The control module receives the turn-on command and controls the switch connected to the control module to be turned on.

In this case, if a voltage signal is detected on the second trunk circuit, a corresponding node ID is obtained from the correspondence between control module IDs and node IDs based on the module ID of the control module, and a node corresponding to the node ID is determined as the faulty node.

Step 204: Control the selected switch to be turned off. If there are unselected switches in the M switches, select a switch from the unselected switches and go back to step 203; or if there is no unselected switch in the M switches, end the process.

In this step, the turn-off command is sent to the selected control module based on the module ID of the control module. The control module receives the turn-off command, and controls a switch connected to the control module to be turned off, so as to turn off the selected switch. If there are unselected module IDs in the obtained module IDs of the M control modules, a module ID is selected from the unselected module IDs, and step 203 is performed again. If the obtained module IDs of the M control modules are all selected, the process ends.

If the obtained module IDs of the M control modules are all selected, current faulty nodes are all detected. A turn-on command is sent to the M control modules based on the module IDs of the M control modules, so that the M control modules control the M switches to be turned on. In this way, when there is another faulty node with a leaking liquid cooling apparatus after the current time, the faulty node can be detected in time.

In a possible embodiment, in a case in which nodes in a cabinet system are divided into a plurality of groups, the leakage detection method may be: controlling, by the processing module, each switch included in each group of switches to be in an initial turn-on state. When an interface of the processing module receives an indication signal, the processing module determines that there is a faulty node with a leaking liquid cooling apparatus. The processing module obtains switch IDs of a group of switches from a stored correspondence between interface IDs, switch IDs, and node IDs based on an interface ID of the interface, and controls each switch in the group of switches to be turned off based on the switch IDs of the group of switches.

The processing module selects a switch ID of a switch from the switch IDs of the group of switches, and controls the switch corresponding to the selected switch ID to be turned on. When receiving an indication signal from the interface, the processing module obtains a corresponding node ID from the correspondence between interface IDs, switch IDs, and node IDs based on the interface ID of the interface and the selected switch ID, and determines that a node corresponding to the node ID is the faulty node with a leaking liquid cooling apparatus.

The processing module controls the selected switch to be turned off based on the selected switch ID. If there are unselected switch IDs in the switch IDs of the group of switches, the processing module selects a switch ID from the unselected switch IDs, and then continues to perform the foregoing operation. If the switch IDs of the group of switches are all selected, the process ends.

In this embodiment of this application, the M switches are first put in an initial turn-on state. When liquid leaking from the liquid cooling apparatus in the faulty node passes through a branch circuit in the faulty node, the branch circuit in the faulty node connects the first trunk circuit and the second trunk circuit, so that when a voltage signal is detected on the second trunk circuit, the faulty node can be detected by controlling the M switches. In this way, only one monitoring module is required to detect liquid cooling apparatuses in different nodes, which reduces detection costs.

Figure 6:
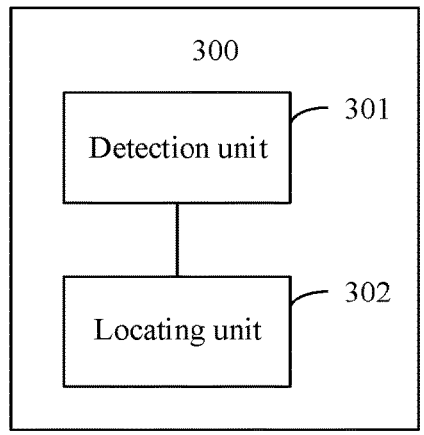
FIG. 6 is a schematic diagram of a structure of still another leakage detection apparatus according to an embodiment of this application.

FIG. 6 shows another leakage detection apparatus 300 according to this application. The leakage detection apparatus 300 includes a detection unit 301 and a locating unit 302.

The detection unit 301 is configured to use a detection circuit to monitor a leakage status of a liquid cooling apparatus in each node included in a cabinet system.

The locating unit 302 is configured to use the detection circuit to locate, when detecting leakage in a liquid cooling apparatus in any node, the faulty node where leakage occurs.

Optionally, the detection unit 301 is configured to determine, when detecting a voltage signal on a second trunk circuit included in the detection circuit for the first time, that leakage occurs in a liquid cooling apparatus in a node.

Optionally, the locating unit 302 is configured to control M switches included in the detection circuit to be turned off, where M is an integer greater than 0. The locating unit 302 selects a switch from the M switches, controls the selected switch to be turned on, and determine a node corresponding to the selected switch as the faulty node when detecting a voltage signal on the second trunk circuit included in the detection circuit.

Optionally, for a detailed implementation process in which the locating unit 302 controls the M switches included in the detection circuit to be turned off, reference may be made to related content in step 202 in the embodiment shown in FIG. 5.

For a detailed implementation process of locating the faulty node by the locating unit 302, reference may be made to related content in steps 203 and 204 in the embodiment shown in FIG. 5.

Optionally, the locating unit 302 may be the processing module 11 in the embodiment shown in FIG. 3 or FIG. 4, and the detection unit 301 may be the voltage detection module 12 in the embodiment shown in FIG. 3 or FIG. 4.

In this embodiment of this application, the detection unit monitors a leakage status of a liquid cooling apparatus in each node included in the cabinet system. When detecting leakage in the liquid cooling apparatus in any node, the locating unit uses the detection circuit to locate the faulty node where leakage occurs. In this way, only one locating unit is required to detect liquid cooling apparatuses in different nodes, which reduces detection costs.

This application further provides a cabinet system. The cabinet system includes the nodes shown in FIG. 1 and a leakage detection apparatus. The leakage detection apparatus is configured to implement the operation steps of the method performed by a corresponding entity in FIG. 5.

All or some of the foregoing embodiments may be implemented using software, hardware, firmware, or any combination thereof. When the software is used to implement the embodiments, all or some of the foregoing embodiments may be implemented in a form of a computer program product. The computer program product includes one or more computer instructions. When the computer program instructions are loaded or executed on a computer, all or some of the procedures or functions according to embodiments of this application are generated.

The computer may be a general-purpose computer, a special-purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), or a semiconductor medium. The semiconductor medium may be a solid-state drive (solid-state drive, SSD).

The foregoing descriptions are merely optional embodiments of this application, but are not intended to limit this application. Any modification, equivalent replacement, or improvement made without departing from the principle of this application should fall within the protection scope of this application.

What is claimed is:

1. A leakage detection apparatus for leakage detection in a cabinet system, the apparatus comprising:
   a detection circuit, coupled to a plurality of nodes of the cabinet system with each node using a liquid cooling apparatus for heat dissipation, wherein the detection circuit comprises a plurality of branch circuits for leakage detection of a plurality of liquid cooling apparatuses in the plurality of nodes, and wherein each branch circuit comprises a water detection cable sensor, a first branch and a second branch, the first branch and the second branch are two conducting wires of the water detection cable sensor; and
   a monitoring device, coupled to the detection circuit and configured to monitor a leakage status of the liquid cooling apparatus in each node, and determine, when leakage occurs in a faulty liquid cooling apparatus, a faulty node where the faulty liquid cooling apparatus resides.

2. The apparatus according to claim 1, wherein the monitoring device comprises a processor and a voltage detector, an input end of the voltage detector is connected to the detection circuit, and an output end is connected to the processor;
   the voltage detector is configured to, when detecting a voltage signal on the detection circuit, determine the leakage occurs, and send an indication signal to the processor; and the processor is configured to receive the indication signal and control the detection circuit to locate the node where the faulty liquid cooling apparatus resides.

3. The apparatus according to claim 1, wherein the detection circuit comprises a first trunk circuit, a second trunk circuit, wherein M branch circuits are respectively located in M nodes in the cabinet system, M is a quantity of the plurality of branch circuits;
one end of the first trunk circuit is connected to a power supply of the cabinet system, the other end of the first trunk circuit is connected to the M branch circuits, one end of the second trunk circuit is connected to the monitoring module, the other end of the second trunk circuit is connected to a switch of each branch circuit, M switches of the M branch circuits are in a turn-on state;
a branch circuit of a faulty node is configured to connect the first trunk circuit and the second trunk circuit when liquid leaking from a liquid cooling apparatus in the faulty node passes through the branch circuit of the faulty node; and
the monitoring device is configured to, when detecting a voltage signal on the second trunk circuit, detect the faulty node where the faulty liquid cooling apparatus resides by controlling the M switches.

4. The apparatus according to claim 3, wherein the monitoring device is configured to control the M switches to be turned off, select a switch from the M switches, control the selected switch to be turned on, and determine that a node corresponding to the selected switch is the faulty node where the faulty liquid cooling apparatus resides when detecting a voltage signal on the second trunk circuit.

5. The apparatus according to claim 3, wherein the detection circuit further comprises M control modules, the M control modules are respectively located in the M nodes, the M control modules are in communication connection with the monitoring device, and each of the M control modules is connected to a control end of a switch corresponding to a node where the control module resides;
the monitoring device is configured to send a turn-off command to the M control modules when detecting a voltage signal on the second trunk circuit; and
one of the M control modules is configured to receive the turn-off command and control a switch connected to the any control module to be turned off.

6. The apparatus according to claim 5, wherein
the monitoring device is further configured to, after sending the turn-off command to the M control modules, select a control module from the M control modules and send a turn-on command to the selected control module;
the selected control module is configured to receive the turn-on command and control a switch connected to the selected control module to be turned on; and
the monitoring device is further configured to, when detecting a voltage signal on the second trunk circuit, determine that the node where the selected control module resides is the faulty node where the faulty liquid cooling apparatus resides.

7. The apparatus according to claim 5, wherein the one of the M control modules is a baseboard management controller (BMC) in a node where the module one of the M control modules resides.

8. The apparatus according to claim 3, wherein a cabinet backplane is disposed in a cabinet in the cabinet system, and the first trunk circuit and the second trunk circuit are located in the cabinet backplane.

9. The apparatus according to claim 8, wherein a switch corresponding to any one of the M nodes is disposed in the cabinet backplane, or a switch corresponding to any node is disposed in the any node.

10. The apparatus according to claim 3, wherein each of the M branch circuits comprises a first branch and a second branch;
the first branch and the second branch are oppositely disposed in a node where the branch circuit resides, and a gap exists between the first branch and the second branch; and
one end of the first branch is connected to the first trunk circuit, and one end of the second branch is connected to the second trunk circuit through a switch.

11. The apparatus according to claim 1, wherein nodes in the cabinet system are divided into a plurality of groups, there are a plurality of detection circuits, and each detection circuit corresponds to a group of nodes; and
the monitoring device is configured to use the plurality of detection circuits to monitor a leakage status of a liquid cooling apparatus in each node in the plurality of groups of nodes, and use a detection circuit corresponding to the any group of nodes to locate, when a faulty node with a leaking liquid cooling apparatus exists in any group of nodes, the node where the faulty liquid cooling apparatus resides in the any group of nodes.

12. A cabinet system, comprising:
a plurality of nodes with each node using a liquid cooling apparatus for heat dissipation; and
a leakage detection apparatus comprising a detection circuit and a monitoring device,
wherein the detection circuit is coupled to the plurality of nodes and comprises a plurality of branch circuits for leakage detection of a plurality of liquid cooling apparatuses in the plurality of nodes, each branch circuit comprises a water detection cable sensor, a first branch and a second branch, the first branch and the second branch are two conducting wires of the water detection cable sensor; and
wherein the monitoring device is coupled to the detection circuit and configured to monitor a leakage status of the liquid cooling apparatus in each node, and determine, when leakage occurs in a faulty liquid cooling apparatus, a faulty node where the faulty liquid cooling apparatus resides.

13. The cabinet system according to claim 12, wherein the monitoring device comprises a processor and a voltage detector, an input end of the voltage detector is connected to the detection circuit, and an output end is connected to the processor;
the voltage detector is configured to, when detecting a voltage signal on the detection circuit, determine the leakage occurs, and send an indication signal to the processor; and
the processor is configured to receive the indication signal and control the detection circuit to locate the faulty node where the faulty liquid cooling apparatus resides.

14. The cabinet system according to claim 12, wherein the detection circuit comprises a first trunk circuit, a second trunk circuit, wherein M branch circuits are respectively located in M nodes in the cabinet system, M is a quantity of the plurality of branch circuits;
one end of the first trunk circuit is connected to a power supply of the cabinet system, the other end of the first trunk circuit is connected to the M branch circuits, one end of the second trunk circuit is connected to the monitoring module, the other end of the second trunk circuit is connected to a switch of each branch circuit, M switches of the M branch circuits are in a turn-on state;

the monitoring device is configured to, when detecting a voltage signal on the second trunk circuit, detect the faulty node where the faulty liquid cooling apparatus resides by controlling the M switches.

15. The cabinet system according to claim 14, wherein the monitoring device is configured to control the M switches to be turned off, select a switch from the M switches, control the selected switch to be turned on, and determine that a node corresponding to the selected switch is the faulty node where the faulty liquid cooling apparatus resides when detecting a voltage signal on the second trunk circuit.

16. The cabinet system according to claim 14, wherein the detection circuit further comprises M control modules, the M control modules are respectively located in the M nodes, the M control modules are in communication connection with the monitoring device, and each of the M control modules is connected to a control end of a switch corresponding to a node where the control module resides;

the monitoring device is configured to send a turn-off command to the M control modules when detecting a voltage signal on the second trunk circuit; and at least one of the M control modules is configured to receive the turn-off command and control a switch connected to the any control module to be turned off.

17. The cabinet system according to claim 16, wherein the monitoring device is further configured to, after sending the turn-off command to the M control modules, select a control module from the M control modules and send a turn-on command to the selected control module;

the selected control module is configured to receive the turn-on command and control a switch connected to the selected control module to be turned on; and the monitoring device is further configured to, when detecting a voltage signal on the second trunk circuit, determine that the node where the selected control module resides is the faulty node where the faulty liquid cooling apparatus resides.

18. The cabinet system according to claim 16, wherein the one of the M control modules is a baseboard management controller (BMC) in a node where the module one of the M control modules resides.

19. The cabinet system according to claim 14, wherein a cabinet backplane is disposed in a cabinet in the cabinet system, and the first trunk circuit and the second trunk circuit are located in the cabinet backplane.

* * * * *